United States Patent [19]

Allman et al.

[11] Patent Number: 5,728,626
[45] Date of Patent: Mar. 17, 1998

[54] SPIN-ON CONDUCTOR PROCESS FOR INTEGRATED CIRCUITS

[75] Inventors: Derryl D. J. Allman; Steven S. Lee, both of Colorado Springs, Colo.

[73] Assignees: AT&T Global Information Solutions Company, Dayton, Ohio; Hyundai Electronics America, San Jose, Calif.; Symbios Logic Inc., Fort Collins, Colo.

[21] Appl. No.: 553,788

[22] Filed: Oct. 23, 1995

Related U.S. Application Data

[63] Continuation of Ser. No. 96,810, Jul. 26, 1993.

[51] Int. Cl.$^6$ .............. B05D 3/02; B05D 5/12; H01L 21/445

[52] U.S. Cl. .......... 438/608; 438/609; 438/626; 438/627; 438/631; 438/688; 438/687; 438/686; 438/685; 427/241; 427/226; 427/229; 427/419.1; 427/419.2

[58] Field of Search ................. 437/225, 203, 437/231, 245, 189, 190, 192, 194, 201; 427/241, 226, 229, 419.1, 419.2; 438/685, 686, 688, 687, 627, 626, 631, 608, 609

[56] References Cited

U.S. PATENT DOCUMENTS

| | | | |
|---|---|---|---|
| 3,723,178 | 3/1973 | Sohlbarand | 437/245 |
| 3,934,336 | 1/1976 | Morse | 29/627 |
| 4,472,458 | 9/1984 | Sirinyan et al. | 437/230 |
| 4,511,601 | 4/1985 | Akse et al. | 437/245 |
| 4,539,222 | 9/1985 | Anderson, Jr. et al. | 437/229 |
| 4,569,876 | 2/1986 | Nakakita | 428/131 |
| 4,617,237 | 10/1986 | Gupta et al. | 428/446 |
| 4,643,913 | 2/1987 | Okunaka et al. | 437/245 |
| 4,770,953 | 9/1988 | Horiguchi et al. | 428/698 |
| 4,776,937 | 10/1988 | Gupta et al. | 204/157.45 |
| 4,795,512 | 1/1989 | Nakatani et al. | 156/89 |
| 4,799,958 | 1/1989 | Morris et al. | 106/1.12 |
| 4,810,669 | 3/1989 | Kobayashi | 437/67 |
| 4,826,709 | 5/1989 | Ryan et al. | 427/240 |
| 4,849,252 | 7/1989 | Arfsten et al. | 427/229 |
| 4,888,210 | 12/1989 | Isozaki et al. | 427/226 |
| 4,921,731 | 5/1990 | Clark et al. | 427/419.2 |

(List continued on next page.)

FOREIGN PATENT DOCUMENTS

| | | |
|---|---|---|
| 5569904 | 5/1980 | Japan. |
| 137656 | 10/1981 | Japan. |
| 5918769 | 1/1984 | Japan. |
| 211370 | 9/1989 | Japan. |
| 271524 | 11/1990 | Japan. |
| 5299373 | 11/1993 | Japan. |
| 2253939 | 9/1992 | United Kingdom. |

OTHER PUBLICATIONS

Grant & Hackh's Chemical Dictionary, 5th Ed. pp. 600–601, 1987.

Wolf, Stanley, *Silicon Processing for the VLSI Era*, vol. 2, pp. 128, 282–286, 1990.

Wolf, Stanley, *Silicon Processing for the VLSI Era*, vol. 2, (1990) pp. 181, 201.

IBM Technical Disclosure Bulletin; May 1973; vol. 15, No. 12, May 1973, pp. 3811–3812.

*Primary Examiner*—Charles L. Bowers, Jr.
*Assistant Examiner*—Matthew Whipple
*Attorney, Agent, or Firm*—Douglas W. Swartz; Wayne P. Bailey

[57] ABSTRACT

A method of planarizing a non-planar substrate, such as filling vias and contact holes, spreads a suspension of a conducting material suspended in a liquid on a substrate. The suspension includes an organometallic material, preferably with particles of a polymerized tin or indium alkoxide. The material is spread by spinning the substrate after applying the suspension. The carrier liquid and organic groups are removed by baking and curing at elevated temperatures, thereby depositing the conductive material on the substrate in a layer which is more planar than the substrate and which has regions of greater and lesser thickness. A relatively brief etch step removes conductive material from regions of lesser thickness, leaving material filling vias or contact holes.

26 Claims, 4 Drawing Sheets

U.S. PATENT DOCUMENTS

| | | | |
|---|---|---|---|
| 4,943,537 | 7/1990 | Harrington, III | 437/34 |
| 4,960,618 | 10/1990 | Tanitsu et al. | 427/226 |
| 4,962,082 | 10/1990 | Barboux et al. | 505/1 |
| 4,972,251 | 11/1990 | Lehrer | 357/54 |
| 4,997,482 | 3/1991 | Haluska et al. | 106/287.16 |
| 5,006,508 | 4/1991 | Treacy et al. | 505/1 |
| 5,011,568 | 4/1991 | Braymen et al. | 156/647 |
| 5,011,725 | 4/1991 | Foster | 428/137 |
| 5,028,455 | 7/1991 | Miller et al. | 427/226 |
| 5,052,102 | 10/1991 | Fong et al. | 29/840 |
| 5,064,685 | 11/1991 | Kestenbaum et al. | 427/53.1 |
| 5,084,323 | 1/1992 | Nagasaka et al. | 428/137 |
| 5,096,745 | 3/1992 | Anderson et al. | 427/226 |
| 5,112,676 | 5/1992 | Lot et al. | 427/226 |
| 5,116,643 | 5/1992 | Miller et al. | 427/226 |
| 5,137,749 | 8/1992 | Yamazaki et al. | 427/226 |
| 5,183,684 | 2/1993 | Carpenter | 427/574 |
| 5,196,229 | 3/1993 | Chau | 427/226 |
| 5,202,152 | 4/1993 | Giannelis et al. | 427/226 |
| 5,213,999 | 5/1993 | Sparks et al. | 437/245 |
| 5,236,874 | 8/1993 | Pintchovski | 437/245 |
| 5,256,443 | 10/1993 | Tomita | 427/241 |
| 5,256,565 | 10/1993 | Bernhardt et al. | 437/230 |
| 5,266,358 | 11/1993 | Uemura et al. | 427/226 |
| 5,290,354 | 3/1994 | Haluska | 106/479 |
| 5,290,733 | 3/1994 | Hayasaka et al. | 437/194 |
| 5,304,533 | 4/1994 | Kobayashi et al. | 427/226 |
| 5,320,913 | 6/1994 | Morimoto et al. | 428/688 |
| 5,403,616 | 4/1995 | Hattori et al. | 427/226 |
| 5,423,285 | 6/1995 | Paz De Araujo et al. | 437/230 |
| 5,466,629 | 11/1995 | Mihara et al. | 437/60 |
| 5,514,822 | 5/1996 | Scott et al. | 427/226 |

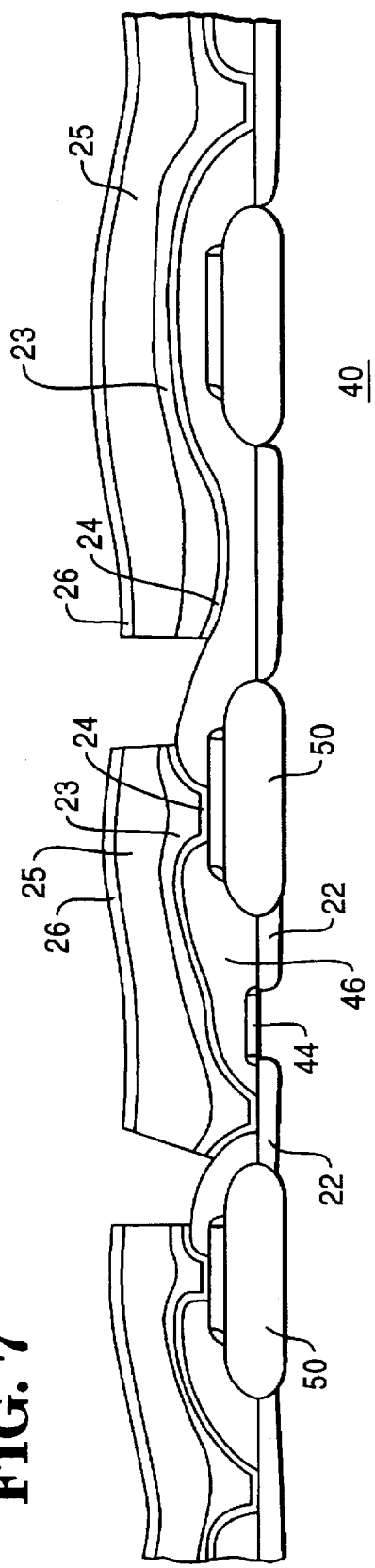

SPIN-ON CONDUCTOR PROCESS FOR INTEGRATED CIRCUITS

This is a continuation of application Ser. No. 08/096,810 filed Jul. 26, 1993.

BACKGROUND

The present invention relates to semiconductor processing and, in particular, to processes which include planarization in producing conductive levels.

Typical manufacturing processes form active devices on a silicon substrate and then interconnect devices using several conductive levels. Insulating layers separate conductive levels, and contact holes (vias) allow interconnection from one conductive level to another.

Methods of forming conductive levels often rely on deposition or photolithographic techniques which suffer when the device surface is uneven. For example, a non-planar wafer surface may prevent a single level from being patterned with a wide range of focus, thereby reducing photolithographic process uniformity and repeatability.

One known technique for the planarization of devices that utilize multi-level metal interconnections involves the deposition of a refractory metal such as tungsten, W, followed by an etchback process to form tungsten "plugs" in contact or via holes.

Although this method has been successfully implemented, it has certain drawbacks that are inherent in the use of a refractory metal. First, a thick deposition of tungsten is required—typically 1.0 to 1.2 times the diameter of the via or contact hole—and a long etch is required to remove the majority of the tungsten from the surface of the wafer. Second, when the tungsten is removed from the surface, the barrier material is exposed at the sides of the hole. If the etch rate for tungsten is less than the etch rate for the barrier material, then the barrier material along the side of the via hole will be removed and leave a void. The third disadvantage arises from the fact that tungsten is deposited by grain growth, and the final tungsten film is composed of individual merged grains. Gaseous tungsten may be unable to diffuse to the bottom of a via before it closes over at the top and forms a seam between the merging wall of tungsten grains.

Other techniques, such as aluminum reflow, have been used to achieve the desired planarization, but these methods also have certain drawbacks. First, aluminum reflow cannot be used if the lower interconnect layer uses aluminum, because reflow requires heating the wafer above the aluminum melting point (>500° C.). Second, the aluminum reflow process is difficult to control and requires very uniform heating and cooling across the wafer within a narrow temperature window. Third, the dielectric film onto which the aluminum is deposited has to be dehydrated by a thermal step prior to deposition. Fourth, a barrier layer (TIN, TIW or W) used to prevent spiking at the junction needs to withstand the high temperatures used in the aluminum reflow deposition. Fifth, the final aluminum thickness—1.0 to 1.5 times the hole diameter—is greater than what is used in a standard process for multilevels of interconnect.

Thus, those working in the art continue their search for alternate methods of device planarization that will eliminate some or all of the limitations of the processes discussed above.

SUMMARY

An objective of the present invention is to provide a method of substrate planarization during the formation of multiple conductive levels.

An additional objective of the present invention is to provide a method for applying a conductive material to a substrate wherein the conductive material both provides substrate planarization and becomes a portion of any conductive level formed on the substrate.

A further objective the present invention is to enable the manufacture of monolithic semiconductor devices which utilize the disclosed methods of planarization and interconnection.

A further objective is to provide a fill process which does not form a seam in the middle of a via.

A further objective is to provide a fill process which leaves very little material on the surface of a wafer.

A further objective is to provide a fill process with a coat material that does not need to be etched away prior to aluminum deposition.

A further objective is to provide a fill process with a coat material that may be etched, but with an etch time less than that for tungsten.

In the first of the preferred embodiments, a spin-on conducting material is used to provide partial to complete contact or via fill for integrated circuits having multiple conductive levels. A suspension of a conductive organometallic material in a suitable liquid is applied to the wafer, partially or completely filling the contact or via holes. The wafer is then baked in an elevated temperature, $N_2/NH_3$ ambient order to remove the remaining solvent and to decrease the organic content of the spun on material. A higher temperature thermal cure is then done in a furnace for 5 minutes to several hours or a Rapid Thermal Anneal (RTA) system for 5 seconds to several minutes. During the thermal cure, the organic content in the material is lowered which reduces the bulk resistance. The metallic film that remains on the surface of the wafer can be plasma etched away leaving the material behind in the holes. The material remaining in the contact or via holes minimizes the thinning problems associated with the deposition of the next conductive layer into the contact or via holes.

In the second preferred embodiment, a spin-on conductive material is used to provide substrate planarization and as a component layer in a multi-layer conductive level. A completely filling the contact or via holes. The deposition (CVD) of a barrier layer may be needed to prevent the interaction of the spin-on material with the silicon substrate. The barrier material can be Ti, TiN, TiW or W. The wafer is then baked to evaporate the liquid present in the suspension. The wafer is then thermally cured using the same method as described in the previous paragraph. The second conductive layer is then deposited onto the planarized surface. The standard photolithography and plasma etch process can be used to define and etch the conductive layers. The wafer is then etched to remove the exposed layers of conductive material, thereby defining the first conductive level leads. A layer of $SiO_2$ is deposited on the wafer to provide insulation between the first and second conductive levels. The $SiO_2$ layer is then planarized using standard existing techniques. The dielectric isolation can be achieved by using other materials besides $SiO_2$, such as polyimide. The wafer is then patterned and etched to define and open the via holes that will permit connection between the first and second conductive levels. The process sequence used to produce the first conductive level is then repeated to produce a second conductive level. The wafer is then patterned and etched to remove the exposed portion of the conductive level, thereby forming the second conductive level.

A wafer may then be finished with a passivation layer and a thermal sinter prior to pre-assembly test.

The planarization method produces a conductor-filled contact or via hole, and the quality of the metallization is improved with respect to step coverage and resistance to electromigration.

BRIEF DESCRIPTION OF THE DRAWINGS

FIG. 7 shows the semiconductor device of FIG. 6 after the definition of the first conductive level; and FIG. 8 shows the semiconductor device of FIG. 7 after deposition and planarization of an interlevel oxide and the deposition of a second conductive level having the same composition as the first conductive level with the exception of the second barrier metal layer.

DETAILED DESCRIPTIONS OF THE PREFERRED EMBODIMENTS

Although the methods and structures of this invention are explained by showing the evolution of an individual MOS device, it should be understood that the use of this particular structure is illustrative only and is in no way intended to limit the application of the disclosed methods. A wide range of devices and structures can be fabricated using these methods.

It is contemplated that the disclosed methods may be applied in the production of MOS (Metal Oxide Semiconductor), BJT (Bipolar Junction Transistor), and BiCMOS (Bipolar Junction Transistor and Complementary Metal Oxide Semiconductor) devices. It is further contemplated that the disclosed methods could be utilized in other thin film applications.

Intermetal Substrate Planarization

Figure 1:
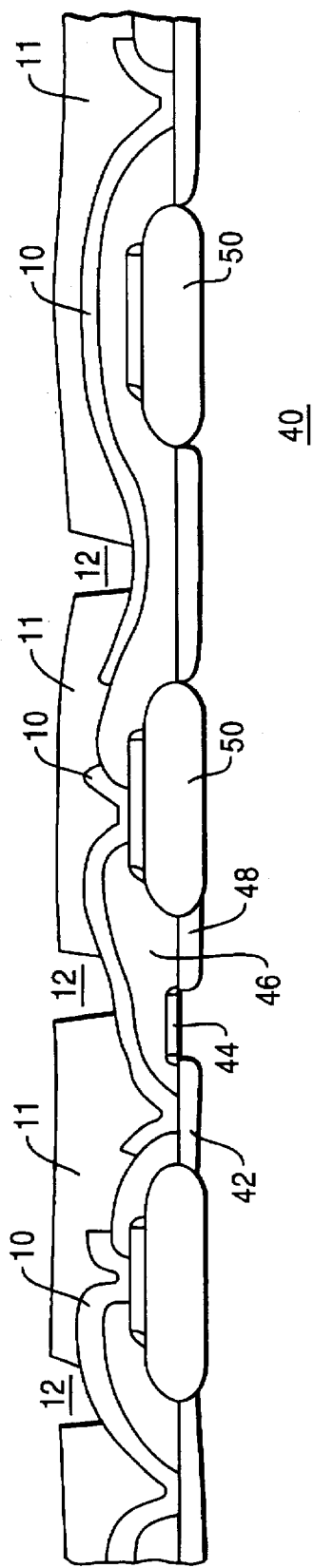
FIG. 1 shows a semiconductor device after deposition of a first conductive level, the deposition and planarization of an overlaying insulating layer, and the opening of via holes to the first conductive level.

In the first preferred embodiment, a spin-on conducting material is used to provide conductor planarization for an integrated circuit which requires the use of multiple conductive levels. FIG. 1 shows a cross-section of a MOS device, including a substrate 40, source 42, drain 48, gate oxide and gate-poly 44, BPSG 46 and field oxide 50, that has been processed to a point prior to the deposition of a second conductive level. A first conductive level, 10, is already in place forming contacts to the source and drain regions, and a first oxide insulating layer, 11, has been deposited over the first conductive level 10. Via holes, 12, have been opened in the insulating layer to permit connection of the first conductive level to a second conductive level.

Spin-on Material Deposition

Figure 2:
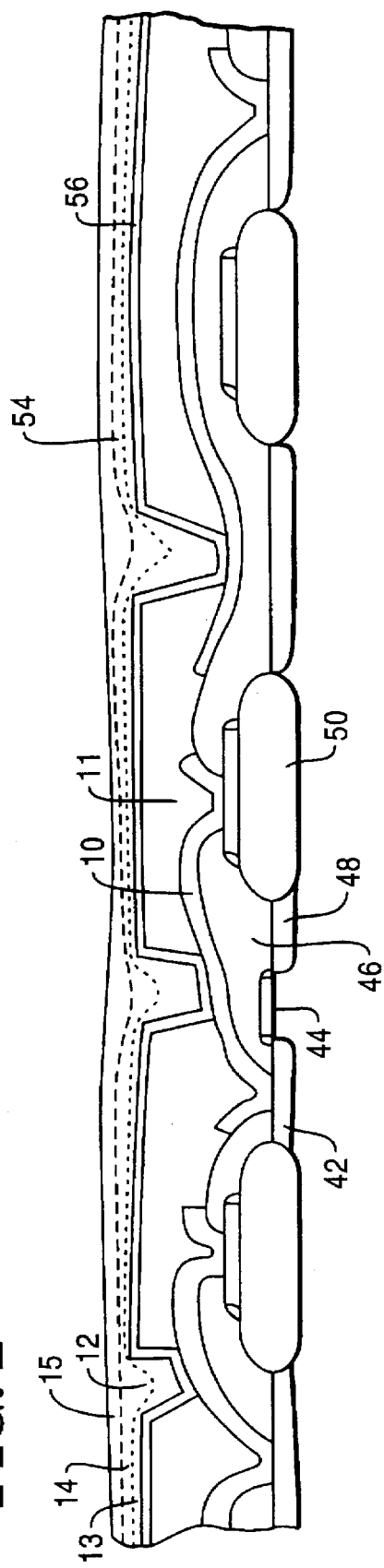
FIG. 2 shows the semiconductor device of FIG. 1 after the deposition of the barrier material and the application of three layers of the spin-on material and cure.

As shown in FIG. 2, a barrier layer 56 is applied. Similar to the application of a photoresist layer, a Sol-Gel is (54 of FIG. 2) dispensed onto the wafer and spun to distribute the suspension across the surface of the wafer. (Suitable Sol-Gel suspensions will be discussed in more detail below.) Rotation speed is quickly ramped up to 3000–5000 rpm with a ramp rate on the order of 50,000 rpm/sec. Depending on the materials selected, Sol-Gel may dry on the spinning surface within 20–30 seconds in an ambient atmosphere. The trapped carrier solvent may be removed from the film after the spin operation by heating the wafer on a hot plate or in an oven at a temperature between 100° C. to 350° C., preferably 150°–250° C. and optimally about 200° C., for 5 seconds to several hours. The organics are removed from the film by a thermal $NH_3/N_2$ cure in a furnace for 5 minutes to several hours or a RTA system for 5 seconds to several minutes at a temperature between 350°–850° C., optimally about 400° C. for a via or about 800° C. for a contact. During the thermal anneal the organic content in the material is lowered which reduces the bulk resistance.

The application/spin sequence may be repeated as required by the particular device topography, but it is contemplated that a series of 2–5 applications will be sufficient to produce the MOS device structure shown in FIG. 2. To illustrate a multi-application process, three distinct application layers, 13, 14, and 15, are indicated in both the field region of the wafer and in the via hole, 12. The topography of the via hole and the liquid state of the suspension combine to produce thicker application layers in via holes and other surface depressions, thereby planarizing the wafer and producing conductive "plugs" in the via holes 12.

Spin-on Layer Etchback and Plug Formation

Figure 3:
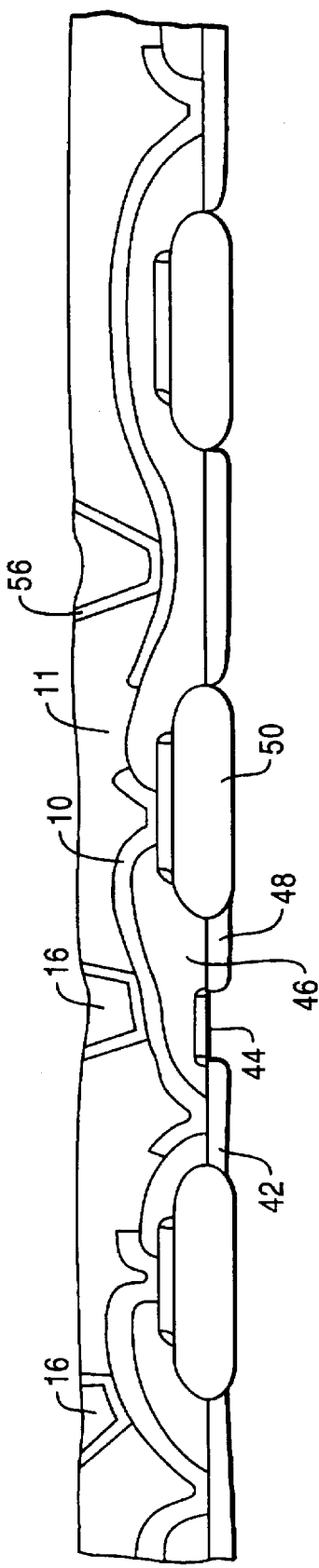
FIG. 3 shows the semiconductor device of FIG. 2 after completion of the spin-on material etch.

After achieving the desired degree of contact or via fill, the wafer is etched to remove a portion of the conductive material. The etch removes the conductive material from the field surface of the wafer and the via hole "plugs" at a similar rate. The etch clears all of the conductive material from the field areas while leaving conductive material in the via hole "plugs," because the conductive material is thicker in the via hole. FIG. 3 shows the MOS device of FIG. 2 after the spin-on layer has been etched to produce conductive "plugs" 16 in the via holes and to remove the spin-on conductive material from the remainder of the wafer surface.

Conductive Level Formation and Passivation

Figure 4:
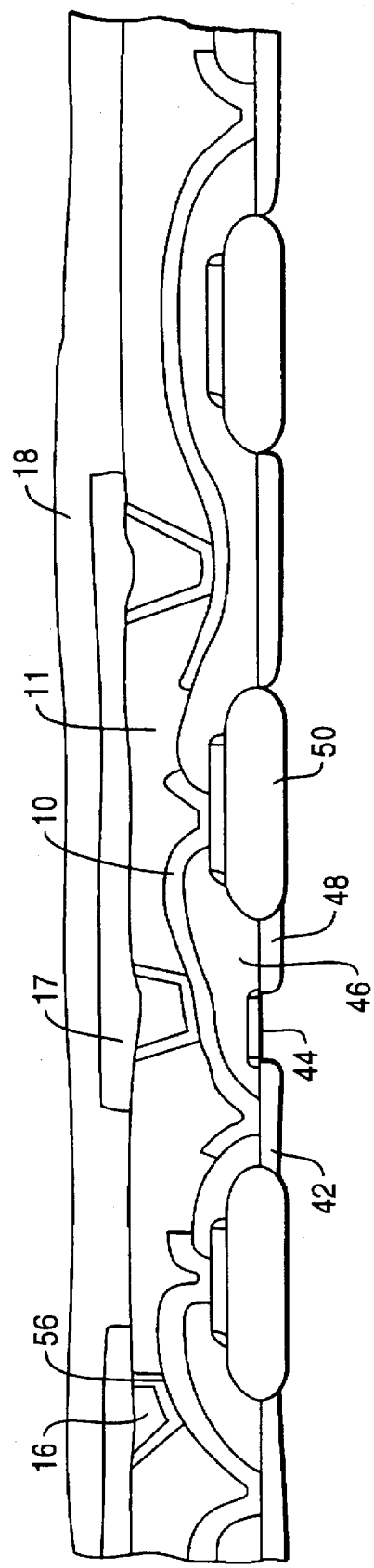
FIG. 4 shows the semiconductor device of FIG. 3 after the deposition, patterning, and etch of a second conductive level.

After the spin-on conductive material has been removed from all but the via regions of the wafer, a second conductive layer, typically an aluminum alloy, is deposited on the wafer. This second conductive layer is then patterned and etched to produce the second conductive level leads 17 as shown in FIG. 4. Also shown is a passivation layer, 18.

Multi-layer Conductor Formation

Figure 5:
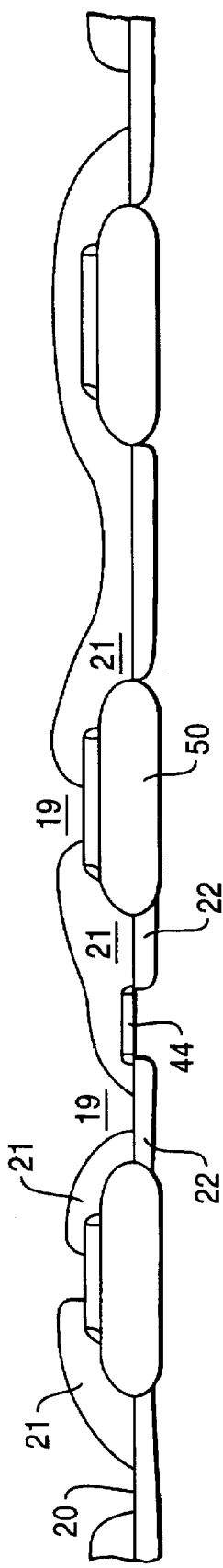
FIG. 5 shows a semiconductor device ready for deposition of the first conductive level.
Figure 6:
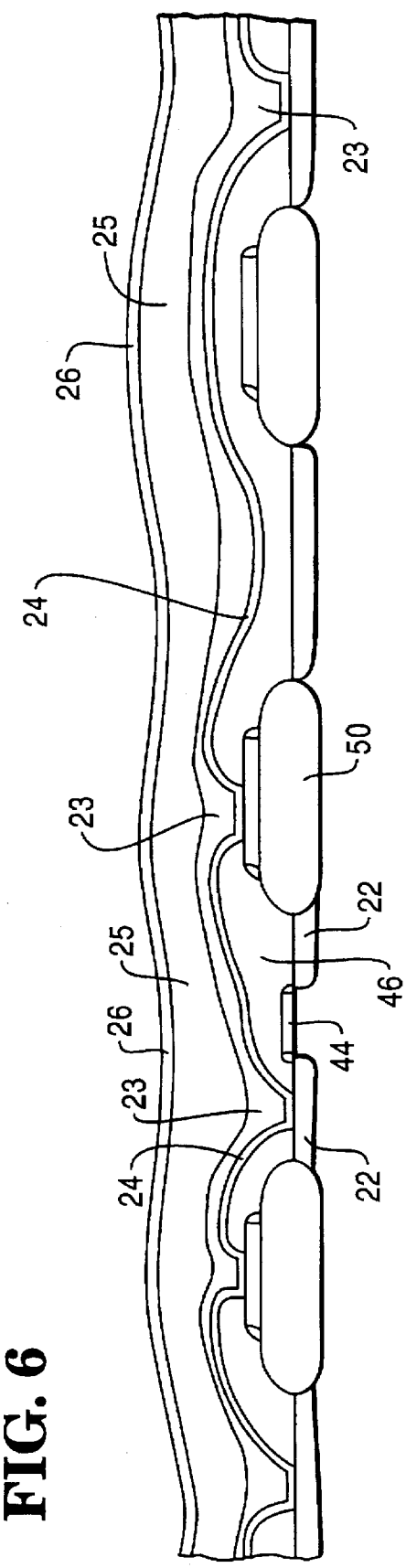
FIG. 6 shows the semiconductor device of FIG. 5 after the application of the first conductive level including deposition of a first barrier metal layer, a layer of the spin-on material and cure, deposition of an aluminum layer, and the deposition of a second barrier metal layer.

In the second preferred embodiment, a spin-on conducting material is used to planarize the device and serve as a component of a multi-layer conductive level for an integrated circuit having multiple conductive levels. FIG. 5 shows a cross-section of MOS device that has been processed to a point prior to the deposition of a first conductive level. Contact holes 19 opened in the insulating layer 21 permit connection of the first conductive level to the MOS source and drain regions 22. The silicon exposed in the contact regions has also been reacted with a refractory metal to form a silicide layer 20 which facilitates binding of the metal to the source and drain regions. A first layer of a barrier metal 24, typically a 500 Å layer of Titanium Nitride (TiN) is then deposited on the wafer, as shown in FIG. 6.

Spin-on Material Deposition

Similar to the application of a photoresist layer, a Sol-Gel solution is dispensed onto the wafer and spun to distribute the suspension across the surface of the wafer. (Suitable Sol-Gel suspensions will be discussed in more detail below.) Rotation speed is quickly ramped up to 3000–5000 rpm with a ramp rate on the order of 50,000 rpm/sec. Depending on the materials selected, Sol-Gel may dry within 20–30 seconds during the spin operation in an ambient atmosphere. The trapped carrier solvents are removed by baking the films on a hot plate or in an oven at 100° C. to 350° C. (optimally about 200° C.) for 5 seconds to several hours. The film is then cured (organic removed) by a thermal process at between 350° C. and 850° C. in a $NH_3/N_2$ ambient which was described earlier. As with the first, it is contemplated that more than one application may be required or desirable.

Completion of First Multi-layer Conductor

The Sol-Gel is followed by a layer of a non-refractory metal, 25, typically 5000 Å layer of an alloy of Al-Cu-Si. These thicknesses will be different for different device geometries. A second layer of a barrier metal 26 is then deposited on the non-refractory metal. This four-layer conductor (barrier, spin-on, refractory, barrier) will be used to produce the first conductive level.

The wafer is then coated with photoresist and patterned to define the first conductive level. The wafer is then etched to remove that portion of conducting the not required for device interconnection. The result of this etch is shown in FIG. 7.

Interlevel Oxide Deposition/Via Pattern and Etch

A layer of an insulating material 30, typically $SiO_2$, is then deposited on the wafer and planarized to provide dielectric isolation of the first and second conductive levels, as seen from FIG. 8. The wafer is then coated with photoresist and patterned to define the via holes 32 that will allow selective connection of the first and second conductive levels. The wafer is then etched to remove the oxide from the via holes. A 500 Å layer of TiN barrier material 34 is then deposited onto the wafer.

Second Spin-on Material Deposition

After the remaining photoresist is removed, a Sol-Gel material 36 is dispensed onto the wafer and spun to distribute the suspension across the surface of the wafer as described above for other applications. Again, it is contemplated that more than one application may be required or desirable.

Completion of Second Multi-layer Conductor

A second layer of a barrier metal 38, typically a 500 Å layer of TiN is then deposited on the wafer. The barrier metal is followed by a layer of a non-refractory metal 40 typically 5000Å layer of an alloy of Al—Cu—Si. If the particular device requires only two conductive levels, the creation of the second conductive level is complete and a second layer of barrier metal is not deposited.

If, however, there are to be more than two conductive levels, the composition of intermediate layers would be similar to that of the first conductive level in that a third layer of barrier metal would separate the Al-Cu-Si alloy from the spin-on conducting material of the subsequent conductive level. Depending on the type of Sol-Gel material used, there could be an interaction with the aluminum which could cause open interconnect lines or high resistant interconnect lines.

This third conductive level would then be patterned and etched to define leads to the second conductive level leads. If the third conductive level is the last conductive level, a passivation layer may be deposited on the wafer to protect the leads.

Sol-Gel Compositions

The term Sol-Gel is used here broadly to describe inorganic compounds prepared by wet chemical methods. These compounds may be inorganic salts or organometallic compounds. This wet chemical approach allows one to prepare a very pure material at a relative low cost for the application of a thin film to a surface. The compounds may be prepared as described below, suspended in a carrier solvent, and then applied to a substrate for planarization as described above.

The preferred precursors in the Sol-Gel process are metal alkoxides. The alkoxides are easily hydrolyzed and polymerized to form a gel. Particles of the polymerized alkoxides are applied to the substrated.

The elements in the first and second column of the periodic table are often added as salts. The acetates of those elements are used instead of the nitrates because of the fact that nitrates tend to crystallize during the drying operation of the gel and they decompose at high temperatures and present a possible explosion hazard.

The hydrolysis reaction with the metal alkoxides is shown below:

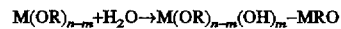

$$M(OR)_{n-m}+H_2O \rightarrow M(OR)_{n-m}(OH)_m-MRO$$

In this reaction, the M is a metallic element and the R is an alkyl ($C_nH_{2n+1}$) group. After the hydrolysis the material is condensed by the reaction shown below:

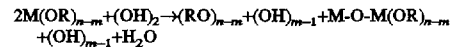

$$2M(OR)_{n-m}+(OH)_2 \rightarrow (RO)_{n-m}+(OH)_{m-1}+M-O-M(OR)_{n-m}$$
$$+(OH)_{m-1}+H_2O$$

The choice of precursors is important in the preparation of multi-component gels, because the reaction rates of alkoxides vary considerably. Larger alkoxy groups hydrolyze more slowly, which allows the reaction rate of more reactive metals to be slowed down by choosing an alkoxy with a larger R group. The time involved in the reaction is still a concern, because substantial ligand exchange may occur which will change the reaction rate of the process over time.

The structure and density of the polymer that is formed by the hydrolysis and condensation reaction are controlled by the pH of the solution. The base-catalyzed reactions produce a more fully cross-linked polymer while the acid-catalyzed reactions tend toward a less dense, more linear cross-linked polymer.

Sol-Gel SnO

A thin layer of tin oxide is transparent in the visible spectrum range and is conductive. The sheet resistance of such an electrode can be less than 10 ohms per square. The following Sol-Gel process can be used to form a spin-on solution of tin oxide which, in turn, can be used as a material to fill a via hole in the interconnect process.

The hydrolysis reaction with the tin alkoxides, bis(tri-n-butyltin) oxide, is shown below:

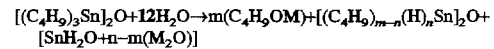

$$[(C_4H_9)_3Sn]_2O+12H_2O \rightarrow m(C_4H_9OM)+[(C_4H_9)_{m-n}(H)_nSn]_2O+$$
$$[SnH_2O+n-m(M_2O)]$$

A similar hydrolysis reaction can be done using the other tin alkoxides materials as shown in the table below.

Tin Alkoxides Compounds

Bis(tri-n-butyltin) sulfate
Hexametylditin
Tetraallytin
Tetraethyltin  Tetramethyldiacetoxystannoxane
Tetramethyltin
tetra-i-propyltin
Tin (II) acetate
Tin (II) iodide Tin (II) oxalate
Tin (II) sulfate
Tin (II) tartrate
Tri-n-butyltin deueride
Trimethyltin hydroxide
Triphenyltin hydroxide
Bis(tri-n-butyltin) sulfide oxide
Diallyldibutyltin
Di-n-butyltinbis(2-ethylhexanoate)
Di-n-butyltin dilaurate
Di-n-butyltin sulfide
Dimetyltin oxide
Diphenyltin oxide
Hexa-n-butylditin
Hexaphenylditin
Tetraamyltin
Tetraphenyltin
Terta-n-propyltin
Tin (II) 2-ethylhexanoate
Tin (II) laurate
Tin (II) stearate
Tin (IV) sulfide
Tri-n-butyltin acetate
Tri-n-butyltin hydride
Triphenyltin acetate
Tri-n-propyltin acetate
n-Butyltin hydroxide
Di-n-butyldiphenyltin
Di-n-butyltin diacetate
Di-n-butyltin oxide
Dimethyldiphenyltin
Dimethyltin sulfide
Diphenyltin sulfide After the hydrolysis reaction the material is condensed by the reaction shown below:

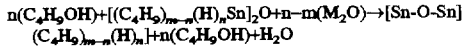

This Sol-Gel solution can be diluted using n-butyl alcohol (or other alcohols) to an appropriate solid content to produce the desired spin-on film thickness.

The iodide and sulfide solutions will have to be cured at a relatively high temperature in the range of 30° C. to 500° C. in order to remove these elements from the final film.

Sol-Gel Solution ITO

The following Sol-Gel process can be used to form an indium tin oxide (ITO) solution. This material is also very conductive (less than 10 ohms per square) and transparent in thin layers. The hydrolysis reaction with the Di-n-butyltin diacetate and triethylindium is shown below:

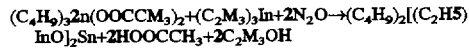

A similar hydrolysis reaction can be done using the other tin alkoxides or other indium alkoxides materials. The tin alkoxides are shown in the previous table while the indium compounds are shown in the table below.

Indium Alkoxides Compounds

Cyclopentadienytlindium (I)
Indium acetylacetonate
Indium (I) chloride anhydrous
Indium Chloride tetrahydrate (anhydrous)
Indium fluoride trihydrate
Indium nitrate hydrate (octahydrate)
Indiumphosphide
Indium sulfate hydrate
Indium trifluoroacetate
trifluoroacetylacetonate
Triethylindium
Indium acetate
Indium bromide
Indium chloride anhydrous
Indium (III) fluoride
Indium iodide
Indium perchlorate
Indium sulfate anhydrous
Indium sulfide
Indium
Trimethylindium After the hydrolysis reaction the material is condensed by the reaction shown below:

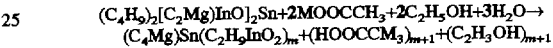

This Sol-Gel solution can be diluted using n-butyl alcohol (or other alcohols) to an appropriate solid content to produce the desired spin-on film thickness.

It is not necessary to combine the indium alkoxide with the tin alkoxide in the Sol-Gel solution. Separate Sol-Gel solutions of indium and tin can be made, and then combined into one solution for spin-on application.

Other Sol-Gel Solutions

Barium titanate and cadmium stannate are also conductive oxide materials which can be placed in Sol-Gel solutions.

Titanium Solution

The following example is a titanium solution that can be used in a spin-on via fill process. The following process only involves a basic condensation reaction. The following reaction involves the interaction of Tetrakis(dimethylamino) titanium with titanium hydride in toluene. The byproduct of this reaction is methylamine, which is a flammable gas. This is a heated reaction that must be done in a nitrogen purged vessel because of the methylamine byproduct.

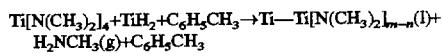

The reaction rate and organotitanium particle size are controlled by the amount of titanium hydride added to the solution and the temperature of the reaction. The Tetrakis (diethylamino)titanium can be used in place of the Tetrakis (dimethylamino) titanium. The byproduct of this reaction would then be ethylamine, a flammable gas byproduct.

Tinitride Solution

Titanium iodide could be substituted in place of the titanium hydride in the above reaction to form a spin-on titanium nitride compound. The by-product of this reaction is methyl iodide, a non-flammable liquid. This is a heated reaction in a nitrogen purged vessel.

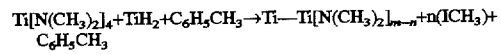

The methyl iodide has a boiling point of 42° C. and can be removed from the solution during the reaction as long as the temperature of the reaction exceeds 42° C. The reaction and particle size of the titanium nitride compound is controlled by the amount of titanium iodide added to the solution and by the temperature of the reaction.

Titanium (IV) bromide or titanium (IV) chloride can be used in place of the titanium iodide in the organotitanium-nitride solution. The methyl bromide chloride is a non-flammable liquid with a boiling point of 50° C. which can be removed from the reaction as long as the reaction temperature exceeds 50° C. The methyl chloride is a flammable gas byproduct which can be removed from the Sol-gel during the reaction.

All of these spin-on titanium-solution examples use toluene as a base or carrier solvent which does not participate in the reaction. However, other solvents could be used as long as they do not contain an oxygen atom in their chemical formulation such as hexane or xylene.

For the via spin-on process the lower conductive material that is exposed in a via needs to be titanium or tinitride.

Other Conductive Solutions

Similar processes can be used to form other organometallic solutions for spin-on via fill, conductor or electrode applications. The following list contains some of the metals that could be used to form organometallic solutions: aluminum, palladium, osmium, nickel, niobium, copper, platinum, rubidium, tantalum, neodymium, molybdenum, lanthanum, iridium and gold.

What is claimed is:

1. A method of planarizing a non-planar substrate comprising the steps of:
   hydrolyzing an organic precursor comprising a conductive material in a liquid to form a polymer containing the conductive material and organic material, the polymer being contained in the liquid;
   repeatedly spreading the polymer suspended in the liquid on at least one surface of the substrate to form a plurality of polymer layers;
   thereafter simultaneously heating all of the plurality of polymer layers to remove at least a portion of any liquid in the plurality of polymer layers and decreasing the organic material of the polymer contained in the polymer layers, thereby depositing the conductive material on the substrate to form a conductive layer which is more planar than the substrate, wherein said conductive layer has regions of greater and lesser thickness; and
   removing substantially all of the conductive material from said regions of lesser thickness while leaving significant amounts of conductive material in said regions of greater thickness to planarize the substrate, wherein the conductive material includes a metal selected from the group consisting of indium, tin, aluminum, palladium, osmium, nickel, niobium, copper, platinum, rubidium, tantalum, neodymium, molybdenum, lanthanum, iridium and gold.

2. The method of claim 1 wherein the surface is a barrier layer comprising a metal selected from the group consisting of Ti, TiN, TiW, and W to inhibit diffusion of the conductive material through the barrier layer.

3. The method of claim 1 further comprising, after each of the repeatedly spreading steps, heating the polymer layers to a temperature greater than ambient temperature to remove at least a portion of the liquid and the organic material.

4. The method of claim 1 wherein said repeatedly spreading step comprises:
   applying the polymer suspended in the liquid on at least one surface of the substrate to form a first layer;
   heating the first layer to a temperature of at least about 100° C. to form a first thermally cured layer;
   applying the polymer suspended in the liquid on the first thermally cured layer to form a second layer; and
   heating the second layer to a temperature of at least about 100° C. to form a second thermally cured layer.

5. The method of claim 4 wherein the temperature ranges from 100° to 350° C.

6. The method of claim 4 wherein the temperature in the simultaneously heating step ranges from about 350° to about 850° C.

7. The method of claim 1 wherein the liquid is a non-aqueous organic solvent that is free of oxygen atoms.

8. The method of claim 4 wherein the organic precursor is a metal alkoxide.

9. A method of planarizing a nonplanar substrate comprising the steps of:
   (a) depositing a first layer of a barrier metal on at least one surface of the substrate, the substrate having a different chemical composition than said first layer;
   (b) hydrolyzing an organic precursor comprising a conducting material in a liquid to form a polymer containing the conducting material and organic material, the polymer being contained in the liquid;
   (c) spreading the polymer suspended in the liquid on at least a portion of the first barrier metal layer, the first barrier metal layer inhibiting interaction of the polymer and liquid with the underlying substrate;
   (d) removing at least a portion of the liquid, thereby depositing the conductive material in a first conductive layer on at least a portion of the first barrier metal layer, wherein the first conductive layer is more planar than said first layer to provide a substantially planar upper surface for the deposition of a second layer and the first conductive layer has a different composition than the barrier metal layer wherein the conducting material includes a metal selected from the group consisting of indium, tin, aluminum, palladium, osmium, nickel, niobium, copper, platinum, rubidium, tantalum, neodymium, molybdenum, lanthanum, iridium and gold; and
   (e) depositing the second layer on the substantially planar upper surface of the first conductive layer.

10. The method of claim 9 wherein step (e) comprises depositing a second conductive layer on at least a portion of the first conductive layer and further comprising:
   (e) depositing an insulating layer on at least a portion of the second conductive layer; and
   (f) repeating steps (a)–(e) to create a second conductive level.

11. The method of claim 10 further comprising the step of planarizing the insulating layer.

12. The method of claim 9 wherein the barrier metal comprises a metal selected from the group consisting of Ti, TiN, TiW, and W to inhibit interaction of the polymer comprising the conducting material and the liquid with a layer located beneath said first layer.

13. A method of planarizing a non-planar substrate comprising the steps of:
   hydrolyzing an organic precursor comprising a conductive material in a liquid to form a polymer containing the conducting material and organic material, the polymer being contained in the liquid;
   depositing the polymer-containing liquid over at least one surface of the substrate to form a film wherein the polymer-containing liquid comprises a carrier solvent that is free of oxygen atoms, wherein the surface is a barrier layer comprising a metal selected from the group consisting of Ti, TiN, TiW, and W to inhibit the interaction of the conductive material with the portion of the substrate underlying the barrier layer; and
   heating the film to remove the liquid and organic material in the organometallic material, thereby depositing the metal in the organometallic material over the substrate in a conductive layer; wherein the heating step is conducted in the presence of a reducing gas to transfer electrons to the carbon in said organic material and thereby volatilize the organic material.

14. The method of claim 13, wherein the temperature in the heating step is less than the melting point of the metal in the organometallic material.

15. The method of claim 13, wherein the temperature in the heating step is no more than about 500° C.

16. The method of claim 13, wherein the reducing gas comprises ammonia.

17. A method of planarizing a non-planar substrate comprising the steps of:

forming a barrier layer;

hydrolyzing an organic precursor comprising a conductive material in a liquid to form a polymer containing the conducting material and organic material, the polymer being contained in the liquid, wherein the conducting material includes a metal selected from the group consisting of indium, tin, aluminum, palladium, osmium, nickel, niobium, copper, platinum, rubidium, tantalum, neodymium, molybdenum, lanthanum, iridium, and gold;

spreading the polymer-containing liquid over the barrier layer to form a film, wherein the barrier layer comprising a metal selected from the group consisting of Ti, TIN., TiW, and W to inhibit the interaction of the conductive material with the substrate;

first heating the film to a first temperature to remove a substantial mount of the liquid and form a dried film; and second heating the dried film to a second temperature greater than the first temperature to remove the organic material in the organometallic material, thereby decreasing the bulk resistance of the dried film and forming a conductive metallic film, wherein both of the heating steps are conducted at different times and in the substantial absence of oxygen gas to inhibit oxidation of the metal in the organometallic material.

18. The method of claim 17, wherein the temperatures in both of the heating steps are less than the melting point of the metal in the organometallic material and the depositing step comprises:

hydrolyzing an organic precursor to form the organometallic material.

19. The method of claim 18 wherein the depositing step comprises:

spreading the organometallic material suspended in the liquid on at least one surface of the substrate and wherein after the second heating step the dried film is more planar than the substrate.

20. The method of claim 17, wherein both of the heating steps are conducted in the presence of a reducing gas to reduce carbon in the organometallic material and thereby volatilize the organic material.

21. The method of claim 17 wherein the liquid comprises a non-aqueous organic solvent for the organometallic material that is free of oxygen atoms.

22. A method of planarizing a non-planar substrate comprising the steps of:

hydrolyzing an organic precursor comprising a conductive material in a liquid to form a polymer containing the conductive material and organic material, the polymer being contained in a liquid;

spreading the polymer suspended in the liquid on at least one surface of the substrate, wherein the surface is a barrier layer comprising a metal selected from the group consisting. of Ti, TiN, TiW, and W to inhibit the interaction of the conductive material with the portion of the substrate underlying the barrier layer; and removing at least a portion of the liquid and decreasing the organic material of the polymer, thereby depositing the conductive material on the substrate to form a conductive layer which is more planar than the substrate, wherein the liquid comprises an organic solvent that is free of oxygen atoms.

23. The method of claim 22 wherein said layer has regions of greater and lesser thickness and further comprising the step of removing substantially all of the conductive material from regions of lesser thickness while leaving significant amounts of conductive material in regions of greater thickness.

24. A method of planarizing a non-planar substrate comprising the steps of:

hydrolyzing an organic precursor comprising a conductive material in a liquid to form a polymer containing the conductive material and organic material, the polymer being contained in a liquid;

spreading the polymer suspended in the liquid on at least one surface of the substrate; and removing at least a portion of the liquid and decreasing the organic material of the polymer, thereby depositing the conductive material on the substrate to form a conductive layer which is more planar than the substrate, wherein the surface is a barrier layer comprising a metal selected from the group consisting of TiN and TiW to inhibit interaction of the conductive material with the portion of the substrate underlying the barrier layer, the barrier layer having a different composition than the conductive layer.

25. A method of planarizing a non-planar substrate comprising the steps (a) depositing a first layer of a barrier metal on at least one surface of the substrate, the substrate having different chemical composition than said first layer and the barrier metal being selected from the group consisting of TiN and TiW;

(b) hydrolyzing an organic precursor comprising a conducting material in a liquid to form a polymer containing the conducting material and organic material, the polymer being contained in the liquid;

(c) spreading the polymer suspended in the liquid on at least a portion of the first barrier metal layer, the first barrier metal layer inhibiting interaction of the polymer and liquid with the underlying substrate;

(d) removing the liquid, thereby depositing the conductive material in a first conductive layer on at least a portion of the first barrier metal layer, wherein the first conductive layer is more planar than said first layer to provide a substantially planar upper surface for the deposition of a second layer and the first conductive layer has a different composition than the barrier metal layer.

26. A method of planarizing a non-planar substrate comprising the steps of:

hydrolyzing an organic precursor comprising a conductive material in a liquid to form a polymer containing the conducting material and organic material, the polymer being contained in a liquid, wherein the conductive material includes a metal selected from the group consisting of indium, tin, aluminum, palladium, osmium, nickel, niobium, copper, platinum, rubidium, tantalum, neodymium, molybdenum, lanthanum, iridium, and gold;

spreading the polymer suspended in the liquid on at least one surface of the substrate; and removing at least a portion of the liquid and decreasing the organic material of the polymer, thereby depositing the conductive material on the substrate to form a conductive layer which is more planar than the substrate, wherein the surface is a barrier layer to inhibit interaction of the conductive material with the portion of the substrate underlying the barrier layer, wherein the barrier layer is selected from the group consisting of Ti, TiN, TiW, and W.

* * * * *

UNITED STATES PATENT AND TRADEMARK OFFICE
CERTIFICATE OF CORRECTION

PATENT NO. : 5,728,626

DATED : March 17, 1998

INVENTOR(S) : Allman et al.

It is certified that error appears in the above-indentified patent and that said Letters Patent is hereby corrected as shown below:

Column 11, line 31, delete "mount" and substitute "amount".

Signed and Sealed this

Eighth Day of September, 1998

Attest:

BRUCE LEHMAN

Attesting Officer

Commissioner of Patents and Trademarks